US009000968B1

United States Patent
Gupta et al.

(10) Patent No.: US 9,000,968 B1
(45) Date of Patent: Apr. 7, 2015

(54) ANALOG-TO-DIGITAL CONVERTER WITH CLOCK HALTING CIRCUIT

(71) Applicants: Sunny Gupta, Noida (IN); Kumar Abhishek, Ghaziabad (IN); Nitin Pant, New Delhi (IN)

(72) Inventors: Sunny Gupta, Noida (IN); Kumar Abhishek, Ghaziabad (IN); Nitin Pant, New Delhi (IN)

(73) Assignee: Freescale Semiconductor, Inc, Austin, TX (US)

( * ) Notice: Subject to any disclaimer, the term of this patent is extended or adjusted under 35 U.S.C. 154(b) by 4 days.

(21) Appl. No.: 14/108,294

(22) Filed: Dec. 16, 2013

(51) Int. Cl.
*H03M 1/12* (2006.01)
*H03M 1/08* (2006.01)
*H03M 1/00* (2006.01)

(52) U.S. Cl.
CPC ............ *H03M 1/0845* (2013.01); *H03M 1/002* (2013.01); *H03M 1/0872* (2013.01)

(58) Field of Classification Search
CPC ... H03M 1/0845; H03M 1/0872; H03M 1/00; H03M 1/001; H03M 1/002; H03M 1/12
USPC .......................................... 341/164, 157, 155
See application file for complete search history.

(56) References Cited

U.S. PATENT DOCUMENTS

| | | | |
|---|---|---|---|
| 6,160,506 A | 12/2000 | Pellon | |
| 6,232,905 B1 | 5/2001 | Smith | |
| 6,266,002 B1 | 7/2001 | Gong | |
| 6,344,811 B1 | 2/2002 | Melanson | |
| 7,116,257 B1 | 10/2006 | Forman | |
| 7,583,137 B2 | 9/2009 | Pederson | |
| 7,714,763 B2 * | 5/2010 | Kim et al. | 341/164 |
| 7,952,510 B2 * | 5/2011 | Shimomura et al. | 341/164 |
| 8,203,472 B2 | 6/2012 | Robinson | |
| 2003/0201927 A1 * | 10/2003 | Watanabe et al. | 341/157 |
| 2009/0146694 A1 * | 6/2009 | Kim et al. | 327/77 |
| 2012/0229319 A1 * | 9/2012 | Takahashi et al. | 341/155 |
| 2012/0320243 A1 * | 12/2012 | Hagihara | 348/294 |
| 2013/0207824 A1 | 8/2013 | Waters | |

OTHER PUBLICATIONS

Data Converter Integration Challenges with on Chip SMPS and Solutions, www.IP.com, Disclosure No. IPCOM000211119D, Sep. 20, 2011.
Subash Sachidananda and Alexander Dean, "Scheduling Switch-Mode Power Supply Noise for Real-Time Systems", FREEDM Systems Center Second Annual Conference, Tallahassee, Florida, May 18-20, 2010.

* cited by examiner

*Primary Examiner* — Jean B Jeanglaude
(74) *Attorney, Agent, or Firm* — Charles Bergere

(57) ABSTRACT

An analog to digital converter (ADC) includes a clock-halting circuit that is enabled by an externally generated trigger signal. The clock-halting circuit halts an input clock signal to the ADC for a predetermined time period and resumes the input clock signal to the ADC when the predetermined time period ends.

14 Claims, 2 Drawing Sheets

ANALOG-TO-DIGITAL CONVERTER WITH CLOCK HALTING CIRCUIT

BACKGROUND OF THE INVENTION

The present invention relates generally to integrated circuits, and more particularly, to an analog-to-digital converter that is gated to avoid power supply noise.

System-on-chips (SoCs) include various digital as well as analog components that are integrated on a single chip. Analog-to-digital converters (ADC) are highly sensitive to noise. Unfortunately, certain components of the SoC, such as switched-mode power supplies (SMPS) and peripheral interfaces, generate noise so if they are located near the ADC, the noise crosses over to the ADC and degrades its performance. The SMPS is one of the major sources of noise in the SoC. The SMPS converts an unregulated supply voltage to a regulated supply voltage, and includes a high frequency switch (usually a metal-oxide semiconductor (MOS) transistor or a bipolar junction transistor (BJT)), referred to as a pass element. The pass element switches between on and off states during voltage regulation, which results in the generation of noise. When the SMPS is located near the ADC, the noise couples to the ADC, which degrades the ADC performance.

Various solutions are available to overcome the above-mentioned problem. One solution is to use a capacitor-input filter at the output of the SMPS to reduce noise. However, as the switching frequency of the pass element increases, the capacitive reactance of the capacitor decreases, which impairs ability of the capacitor-input filter to reduce the noise of the SMPS. Another solution is to use choke filters that include an inductor connected in series and a capacitor connected in parallel with the output of the SMPS. However, the inductor introduces magnetic field interferences on the ADC, which again degrades performance and also increases cost. Using passive components such as capacitors and inductors further increases chip area, which restricts their use in small-scale circuits.

Yet another solution uses a software application to manage the noise coupled to the ADC. A processor runs a scheduling algorithm that schedules ADC tasks based on the switching activity of the SMPS pass element, i.e., the ADC functions only when the pass element is not switching. However, this solution fails to reduce the noise coupling for SoCs that do not include a processor. The ADC throughput also suffers because software-based ADC scheduling consumes time. Scheduling algorithms further negatively affect the sampling rate of the ADC.

Therefore it would be advantageous to have an ADC that is not susceptible to on-chip noise and maintains a uniform sampling rate, yet does not consume too much area and power.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
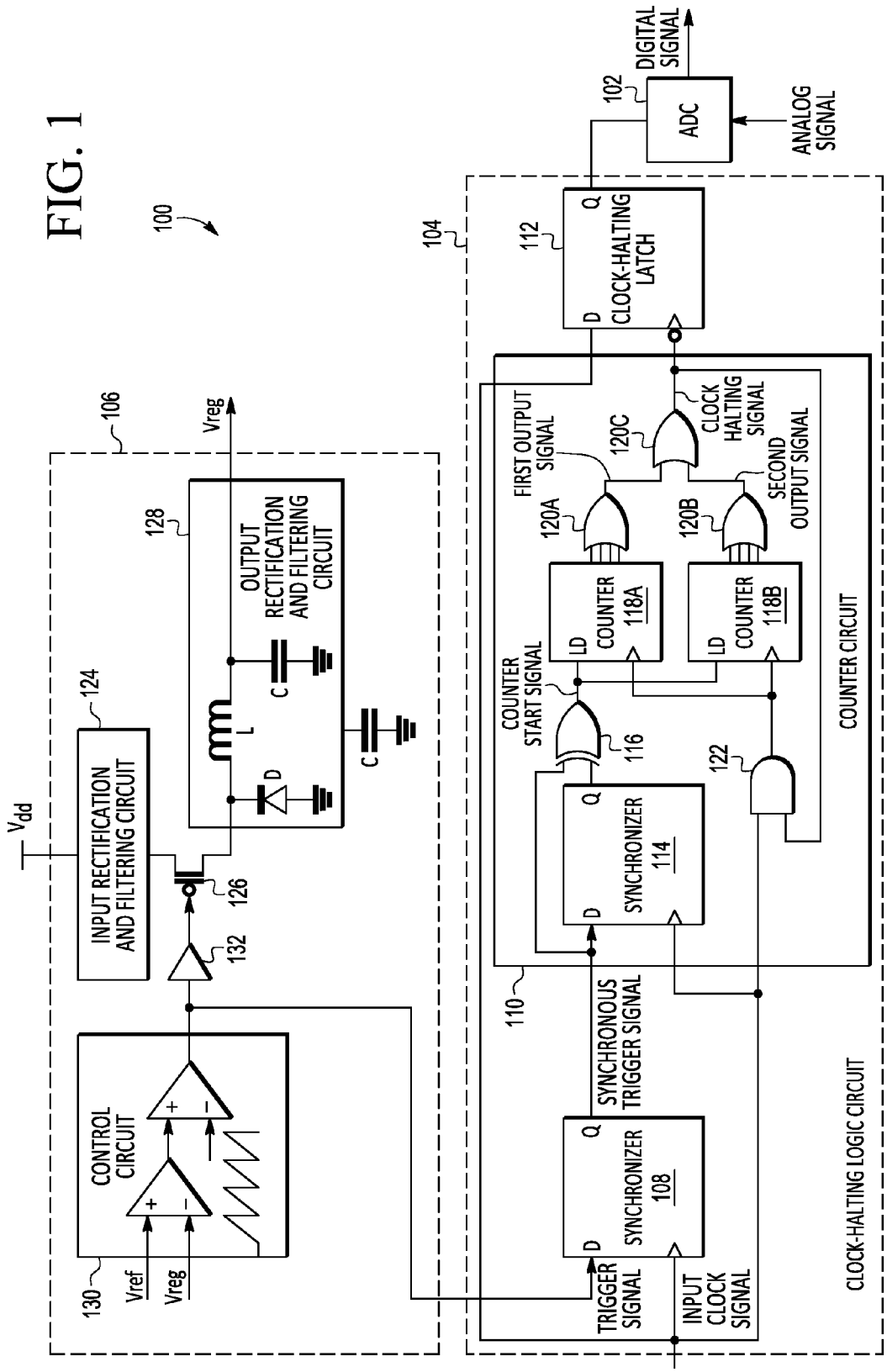
FIG. 1 is a schematic block diagram of an ADC in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system that converts an analog signal to a digital signal is provided. The system includes an analog-to-digital converter (ADC) and a clock-halting circuit. The ADC has an input terminal that receives the analog signal, a clock input terminal for receiving an input clock signal, and an output terminal that outputs the digital signal. The clock-halting circuit is connected to the clock input terminal of the ADC for halting the input clock signal based on an external trigger signal. The trigger signal toggles between logic high and low states. The clock-halting circuit includes a synchronizer, a counter, and a clock-halting latch. The synchronizer has an input terminal for receiving the trigger signal, a clock input terminal for receiving the input clock signal, and an output terminal for outputting a synchronous trigger signal. The counter has an input terminal connected to the output terminal of the synchronizer for receiving the synchronous trigger signal and a clock input terminal for receiving the input clock signal. The counter starts a count of a predetermined set of count values after the trigger signal toggles between the logic high and low states. The predetermined set of count values corresponds to a predetermined time period. The clock-halting latch is connected to the counter for halting the input clock signal for the predetermined time period.

In another embodiment of the present invention, an integrated circuit that includes a switched-mode power supply (SMPS), an analog-to digital converter (ADC), and a clock-halting circuit is provided. The SMPS receives an external unregulated supply voltage and generates a regulated voltage. The SMPS includes a control circuit that generates a trigger signal to control switching of a switching element of the SMPS. The trigger signal toggles between high and low states. The ADC has an input terminal for receiving the analog signal, a clock input terminal for receiving an input clock signal, and an output terminal for outputting the digital signal. The clock-halting circuit is connected between the ADC and SMPS, receives the trigger signal, and halts the input clock signal to the clock input terminal of the ADC. The clock-halting circuit includes a synchronizer, a counter, and a clock-halting latch. The synchronizer has an input terminal for receiving the trigger signal, a clock input terminal for receiving the input clock signal, and an output terminal for outputting a synchronous trigger signal. The counter receives the synchronous trigger signal and the input clock signal and counts a predetermined set of count values after the trigger signal toggles between the logic high and low states. The predetermined set of count values corresponds to a predetermined time period. The clock-halting latch is connected to the counter and halts the input clock signal for the predetermined time period.

Various embodiments of the present invention provide a system that converts an analog signal to a digital signal. The system includes an analog-to-digital converter (ADC) and a clock-halting circuit. The system is integrated on a system-on-chip (SoC) that includes components, such as a switched-mode power supply (SMPS) that generates noise that may cause the ADC to function erroneously. A trigger signal generated by the SMPS indicates when the SMPS is generating noise that may affect the ADC. The trigger signal toggles between logic high and low states. The clock-halting circuit is connected between the SMPS and a clock input terminal of the ADC and halts the input clock signal to the ADC for a predetermined time period when the trigger signal toggles. The predetermined time period corresponds to the time required for the noise to fade out. The ADC halts the analog-to-digital conversion process during this predetermined time period. When the predetermined time period ends, the clock-halting circuit resumes the input clock signal to the ADC and the ADC resumes the conversion process. Thus, the system of the present invention effectively manages noise coupling on the ADC. The clock-halting circuit can be implemented using a combination of simple digital circuits that include a synchronizer, counters, various logic gates, and a clock-halting latch, as opposed to existing solutions that use capacitors and inductors.

Referring now to FIG. 1, a schematic block diagram of a system 100 for converting an analog signal to a digital signal in accordance with an embodiment of the present invention is shown. The system 100 includes an analog-to-digital converter (ADC) 102 and a clock-halting circuit 104. The ADC 102 has an input terminal for receiving the analog signal, a clock input terminal for receiving an input clock signal, and an output terminal for outputting the digital signal.

In various embodiments of the present invention, the system 100 is integrated on a system-on-chip (SoC, not shown) that has various other components (analog as well as digital) that are in close proximity to the ADC 102. An example of such a component is a switched-mode power supply (SMPS) 106. The SMPS 106 generates noise that can interfere with the operation of the ADC 102. Though the SMPS 106 has been illustrated as the noise source, it will be appreciated by those of skill in art that noise may be generated by other on-chip components of the SoC including peripheral interfaces.

To protect the ADC 102 from the noise generated by the SMPS 106, the clock-halting circuit 104 is connected to the clock input terminal of the ADC 102. The clock-halting circuit a synchronizer 108, a counter 110, and a clock-halting latch 112. In the embodiment shown, the counter 110 includes a D flip-flop 114, an exclusive OR (XOR) gate 116, first and second N-bit down counters 118a and 118b, first through third OR gates 120a-120c, and an AND gate 122.

The synchronizer 108 is a dual-edge synchronizer and has a clock input terminal that receives an input clock signal from a clock source (not shown), an input trigger terminal that receives a trigger signal from the SMPS 106, and an output terminal for outputting a synchronous trigger signal. The D flip-flop 114 is a dual-edge triggered flip-flop and has a clock input terminal that receives the input clock signal from the clock source, an input terminal connected to the output terminal of the synchronizer 108 for receiving the synchronous trigger signal, and an output terminal. The synchronizer 108 and the D flip-flop 114 both are dual-edge triggered devices whose outputs change at either edge (positive and negative edges) of the input clock signal, based on the change in their D inputs.

The XOR gate 116 is connected to the output terminals of the synchronizer 108 and the D flip-flop 114, respectively, and generates a counter start signal at its output. The first and second N-bit down counters 118a and 118b each have a clock input terminal for receiving the input clock signal by way of the AND gate 122, while load and start terminals (LD) of the first and second N-bit down counters 118a and 118b are connected to the output of the XOR gate 116 and receive the counter start signal. The first and second N-bit down counters 118a and 118b are programmed to count a predetermined set of count values that corresponds to a predetermined time period. First and second sets of N-bit count values are obtained at output terminals of the first and second N-bit down counters 118a and 118b, respectively. It will be appreciated by those of skill in art that the first and second N-bit down counters 118a and 118b may be replaced with N-bit up counters.

Input terminals of the first and second OR gates 120a and 120b are connected to the output terminals of the first and second N-bit down counters 118a and 118b, respectively, for receiving the first and second sets of N-bit count values. The first and second OR gates 120a and 120b may be N-input OR gates, where N corresponds to the bit size of the first and second N-bit down counters 118a and 118b. The third OR gate 120c is connected to the first and second OR gates 120a and 120b and receive the outputs signals thereof. The third OR gate 120c generates a clock halting signal. The AND gate 122 has a first input terminal connected to the output terminal of the third OR gate 120c for receiving the clock halting signal and a second input terminal for receiving the input clock signal. An output terminal of the AND gate 122 is connected to the clock input terminals of the first and second N-bit down counters 118a and 118b. The clock-halting latch 112 has a clock input terminal that is connected to the output terminal of the third OR gate 120c for receiving the clock halting signal, a data input terminal that receives the input clock signal, and an output terminal connected to the clock terminal of the ADC 102 for providing the input clock signal to the ADC 102.

The SMPS 106 is well known to those of skill in art and includes an input rectification and filtering circuit 124, a high frequency switch 126, an output rectification and filtering circuit 128, a control circuit 130, and a buffer 132. The input rectification and filtering circuit 124 receives an unregulated input supply voltage (Vdd) and generates an unregulated voltage. The high frequency switch 126 is connected to the input rectification and filtering circuit 124 and switches the unregulated voltage to generate a voltage pulse train of the unregulated voltage. The output rectification and filtering circuit 128 is connected to the high frequency switch 126 and rectifies and filters the voltage pulse train and generates a regulated voltage (Vreg). The control circuit 130 is connected to the output rectification and filtering circuit 128 by way of the buffer 132 and generates a trigger signal that controls the switching of the high frequency switch 126 to obtain a stable regulated voltage.

Figure 2:
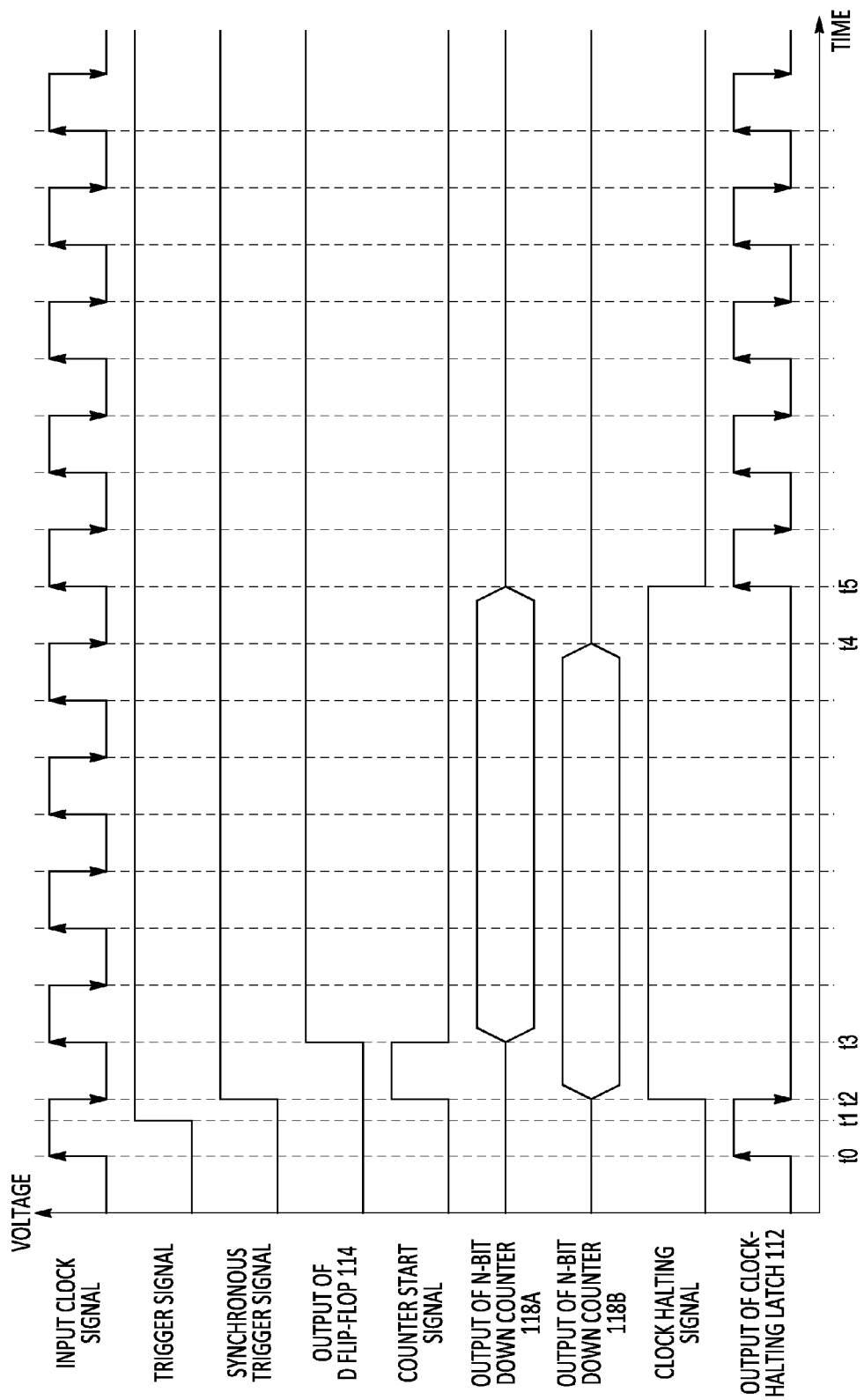
FIG. 2 is a timing diagram of various signals of the ADC of FIG. 1.

FIG. 2 shows a timing diagram of the input clock signal, the trigger signal, the synchronous trigger signal, the counter start signal, the clock halting signal, and the output of the clock-halting latch 112 of the system 100.

When the trigger signal toggles between logic high and low states, noise is generated. The trigger signal may be a periodic or a non-periodic signal. In an embodiment of the present invention, when the trigger signal is a periodic signal, the frequency of the trigger signal is less than a frequency of the input clock signal. The noise may interfere with the input clock signal and cause the ADC 102 to function erroneously. To prevent the noise from interfering with the operation of the ADC 102, the input clock signal to the ADC 102 is halted for the predetermined time period. The predetermined time period is the time required for the noise generated by the SMPS 106 to fade out after the trigger signal has toggled. This time may be determined experimentally.

When the trigger signal toggles, the synchronizer 108 synchronizes the trigger signal with the input clock signal and generates a synchronous trigger signal. As shown in FIG. 2, when the trigger signal toggles from low to high (at time t1), the synchronizer 108 generates the synchronous trigger signal at the subsequent negative edge of the input clock signal (time t2). Likewise, the D flip-flop 114 receives and outputs the synchronous trigger signal at the subsequent positive edge of the input clock signal (time t3).

At time t2, the synchronous trigger signal is at a logic high state and the output of the D flip-flop 114 is at a logic low state, hence, the counter start signal goes from low to high. The counter start signal, generated at the output terminal of the XOR gate 116, loads the predetermined set of count values into the first and second N-bit down counters 118a and 118b, which in turn begin the count of the predetermined set of count values at time t2. In an embodiment of the present invention, the first N-bit down counter 118a is a positive edge triggered counter and the second N-bit down counter 118b is a negative edge triggered counter. For example, if the time period of the input clock signal is 12.5 nanoseconds and the predetermined time period is 25-30 nanoseconds, the first and second N-bit down counters 118a and 118b are each programmed to count 4 clock cycles, i.e., for a time period of 50 nanoseconds. Thus, each of the first and second N-bit down counters 118a and 118b are loaded with binary-equivalent count values of 4. The first N-bit down counter 118a counts at every positive edge of the input clock signal (starting at time t3) and the second N-bit down counter 118b counts at every negative edge of the input clock signal (starting at time t2). The count values obtained at the output terminals of the first and second N-bit down counters 118a and 118b cause the first and second OR gates 120a and 120b to generate the first and second output signals. The third OR gate 120c receives the first and second output signals and generates the clock halting signal (at time t2). Since the clock halting signal is in a logic high state, the AND gate 122 propagates the input clock signal to the clock input terminal of the first and second N-bit down counters 118a and 118b. The clock-halting latch 112 is an active-low latch and receives the clock halting signal at the clock input terminal thereof and latches the input clock signal to the last state thereof. Thus, the input clock signal to the ADC 102 is halted.

When the first and second N-bit down counters 118a and 118b complete the count of the predetermined set of count values and output a logic low value (at times t5 and t4, respectively), the first and second output signals generated by the first and second OR gates 120a and 120b, respectively, go low. Thus, the clock halting signal generated at the output terminal of the third OR gate 120c goes low at time t5. The AND gate 122 receives the logic low clock halting signal and gates the input clock signal to the clock terminals of the first and second N-bit down counters 118a and 118b. Thus, the first and second N-bit down counters 118a and 118b stop counting. Further, the clock input terminal of the clock-halting latch 112 receives the logic low clock halting signal and then outputs the input clock signal to the clock input terminal of the ADC 102 (from the last latched state of the input clock signal at time t5). Thus, the ADC 102 resumes operation at time t5.

It will be understood by those of skill in the art that the same logical functions may be performed by different arrangements of logic gates, or that logic circuits operate using either positive or negative logic signals. Therefore, variations in the arrangement of some of the logic gates described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for converting an analog signal into a digital signal, comprising:
   an analog-to-digital converter (ADC) having an input terminal for receiving the analog signal, a clock input terminal for receiving an input clock signal, and an output terminal for outputting the digital signal; and
   a clock-halting circuit, connected to the clock input terminal of the ADC, for halting the input clock signal to the ADC based on an external trigger signal, wherein the trigger signal toggles between logic high and low states, and wherein the clock-halting circuit includes:
      a synchronizer having an input terminal for receiving the trigger signal, a clock input terminal for receiving the input clock signal, and an output terminal for outputting a synchronous trigger signal;
      a counter circuit having an input terminal connected to the output terminal of the synchronizer for receiving the synchronous trigger signal and a clock input terminal for receiving the input clock signal, wherein the counter circuit starts a count of a predetermined set of count values after the trigger signal toggles between the logic high and low states, and wherein the predetermined set of count values corresponds to a predetermined time period; and
      a clock-halting latch, connected between the counter circuit and the clock input terminal of the ADC, for halting the input clock signal to the ADC for the predetermined time period.

2. The system of claim 1, wherein the counter circuit comprises:
   a D flip-flop having an input terminal connected to the output terminal of the synchronizer for receiving the synchronous trigger signal, a clock input terminal for receiving the input clock signal, and an output terminal;
   a first logic gate having first and second input terminals connected to the output terminals of the synchronizer and the D flip-flop, respectively, and an output terminal for outputting a counter start signal;
   first and second counters each having an input terminal connected to the output terminal of the first logic gate for receiving the counter start signal, a clock input terminal for receiving the input clock signal, and an output terminal for outputting respective first and second sets of count values that initiate the count of the predetermined set of count values;
   second and third logic gates connected to the output terminals of the first and second counters for receiving the first and second sets of count values, respectively, and generating first and second output signals;
   a fourth logic gate having first and second input terminals connected to the second and third logic gates for receiving the first and second output signals and generating a clock halting signal; and
   a fifth logic gate having a first input terminal connected to the fourth logic gate for receiving the clock halting signal, a second input terminal for receiving the input clock signal, and an output terminal connected to the clock input terminals of the first and second counters for gating the input clock signal upon completion of the predetermined time period.

3. The system of claim 2, wherein the first, second, third, fourth, and fifth logic gates each comprise at least one of an OR gate and an AND gate.

4. The system of claim 2, wherein the first and second counters each comprise at least one of a positive and a negative edge trigger counter.

5. The system of claim 1, wherein the clock-halting latch has an input terminal that receives the input clock signal, a clock input terminal that receives the clock halting signal, and an output terminal connected to the clock input terminal of the ADC that outputs the clock halting signal during the predetermined time period.

6. The system of claim 1, wherein the synchronizer comprises a dual-edge triggered flip-flop.

7. The system of claim 1, wherein the trigger signal is received from a noise source.

8. The system of claim 7, wherein the noise source comprises a switched-mode power supply (SMPS).

9. An integrated circuit, comprising:
 a switched-mode power supply (SMPS), for receiving an external unregulated supply voltage and generating a regulated voltage, wherein the SMPS includes:
  a control circuit for generating a trigger signal to control switching of a switching element;
 an analog-to-digital converter (ADC) having an input terminal for receiving an analog signal, a clock input terminal for receiving an input clock signal, and an output terminal for outputting a digital signal; and
 a clock-halting circuit, connected between the ADC and the SMPS, for receiving the trigger signal and halting the input clock signal to the ADC, wherein the clock-halting circuit includes:
  a synchronizer having an input terminal connected to the control circuit for receiving the trigger signal, a clock input terminal for receiving the input clock signal, and an output terminal for outputting a synchronous trigger signal;
  a counter circuit having an input terminal connected to the output terminal of the synchronizer for receiving the synchronous trigger signal and a clock input terminal for receiving the input clock signal, wherein the counter circuit, when triggered by the synchronous trigger signal, starts a count of a predetermined set of count values, wherein the predetermined set of count values corresponds to a predetermined time period; and
  a clock-halting latch, connected to the counter circuit and the clock input terminal of the ADC, for halting the input clock signal for the predetermined time period.

10. The integrated circuit of claim 9, wherein the counter circuit comprises:
 a D flip-flop having an input terminal connected to the output terminal of the synchronizer for receiving the synchronous trigger signal, a clock input terminal for receiving the input clock signal, and an output terminal for outputting the synchronous trigger signal;
 a first logic gate having first and second input terminals connected to the output terminals of the synchronizer and the D flip-flop, respectively, for receiving the synchronous trigger signal, and an output terminal for outputting a counter start signal;
 first and second counters each having an input terminal connected to the output terminal of the first logic gate for receiving the counter start signal, a clock input terminal for receiving the input clock signal, and an output terminal for outputting first and second sets of count values;
 second and third logic gates connected to the output terminals of the first and second counters for receiving the first and second set of count values, respectively, and generating first and second output signals;
 a fourth logic gate having first and second input terminals connected to the second and third logic gates, for receiving the first and second output signals and generating a clock halting signal;
 a fifth logic gate having a first input terminal connected to the fourth logic gate for receiving the clock halting signal, a second input terminal for receiving the input clock signal, and an output terminal connected to the clock input terminals of the first and second counters for gating the input clock signal to the first and second counters upon completion of the predetermined time period.

11. The integrated circuit of claim 10, wherein the first, second, third, fourth, and fifth logic gates each comprise at least one of an OR gate and an AND gate.

12. The integrated circuit of claim 10, wherein the first and second counters each comprise at least one of a positive and a negative edge triggered counter.

13. The integrated circuit of claim 9, wherein the clock-halting latch has an input terminal that receives the input clock signal, a clock input terminal that receives the clock halting signal, and an output terminal, connected to the clock input terminal of the ADC, that outputs the clock halting signal during the predetermined time period.

14. The integrated circuit of claim 9, wherein the synchronizer comprises a dual-edge triggered flip-flop.

* * * * *